United States Patent [19]
Chang et al.

[11] Patent Number: 5,596,209
[45] Date of Patent: Jan. 21, 1997

[54] PHOTOCONDUCTIVE SEMICONDUCTOR CONTROL DEVICE

[75] Inventors: Peter L. D. Chang, Nashua; Marcel T. Bergeron, Manchester, both of N.H.

[73] Assignee: Lockheed Sanders, Inc., Nashua, N.H.

[21] Appl. No.: 239,482

[22] Filed: May 9, 1994

[51] Int. Cl.$^6$ ............................................. H01L 31/00
[52] U.S. Cl. ........................... 257/80; 257/439; 257/432; 257/459
[58] Field of Search ....................... 257/439, 430, 257/459, 82, 80, 432

[56] References Cited

U.S. PATENT DOCUMENTS 3,917,943  11/1975  Auston ................................. 257/459 X
4,899,204  2/1990  Rosen et al. ........................... 257/82 X

FOREIGN PATENT DOCUMENTS 0275349   1/1990   Germany ............................. 257/459
56-147490 11/1981  Japan ................................... 257/84
5712570   1/1982   Japan ................................... 257/459
0287079   7/1990   Japan ................................... 257/465

*Primary Examiner*—William Mintel
*Attorney, Agent, or Firm*—David W. Gomes

[57] ABSTRACT

The present invention provides a radiant energy activated semiconductor control device having N+ ion implanted regions exposed to the radiant energy for switching purposes.

7 Claims, 1 Drawing Sheet

PHOTOCONDUCTIVE SEMICONDUCTOR CONTROL DEVICE

FIELD OF THE INVENTION

The present invention generally relates to devices used for controlling radio frequency energy and, in particular, to such devices that are optically controlled and energized.

STATEMENT OF THE PRIOR ART

Certain needs have arisen for the development of radio frequency control devices such as switches which are operable in very high energy density, electromagnetic environments and in devices in which electrical control signals are either undesirable or need to be isolated. Such switches are preferably optically controlled and energized. This eliminates the presence of electrical conductors and electrical control signals which could capacitatively and inductively couple with r.f. energy and adversely affect system performance.

It is known that light energy at various frequencies can generate electrical carriers and allow current to flow in semiconductor material such as intrinsic silicon. However, there have been difficulties in increasing the current carrying capability of such devices while maintaining the directional uniformity necessary for use with r.f. energy.

Research has been conducted on optically controlled switches, especially in relation to enhancement of the performance characteristic of turn-on speed. Such switches have been powered by pulse lasers and have demonstrated rise, or turn-on times near one picosecond. These devices quickly become conductive and DC current flows through them in an avalanche phenomenon. The switches turn off when the current flow subsides.

Unfortunately, some potential applications of such switches require the exercise of greater control over the current flow, such as turn-off as well as turn-on, and the application to r.f. signals places even more demands on switch performance.

SUMMARY OF THE INVENTION

Therefore, it is an object of the present invention to provide an optically controlled and energized electrical device which exhibits good switching characteristics for both the turn-on and turn-off functions.

It is a further object of the present invention to provide such a device which is effective for use with alternating current signals such as r.f..

It is a further object of the present invention to provide such a switch having improved current carrying capability.

Accordingly, the present invention provides a semiconductor control device, including a substantially undoped semiconductor substrate, through which electrical current flow is to be controlled, having at least one doped region formed therein, and means for directing radiant energy onto the doped region and undoped semiconductor for controlling current flow through the substrate in response to an electrical potential thereacross.

BRIEF DESCRIPTION OF THE DRAWINGS

The present invention is illustratively shown and described in reference to the enclosed drawings in which.

DETAILED DESCRIPTION OF THE INVENTION

Figure 1:
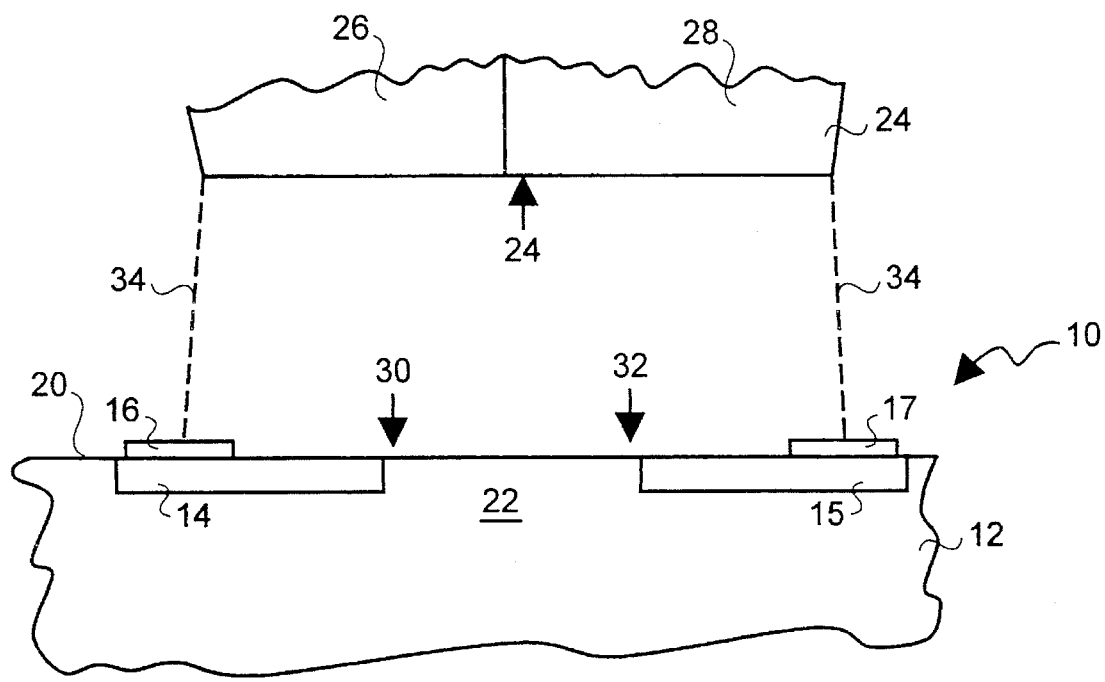
FIG. 1 is a representational side view of an optically energized semiconductor device constructed in accordance with one embodiment of the present invention.
Figure 2:
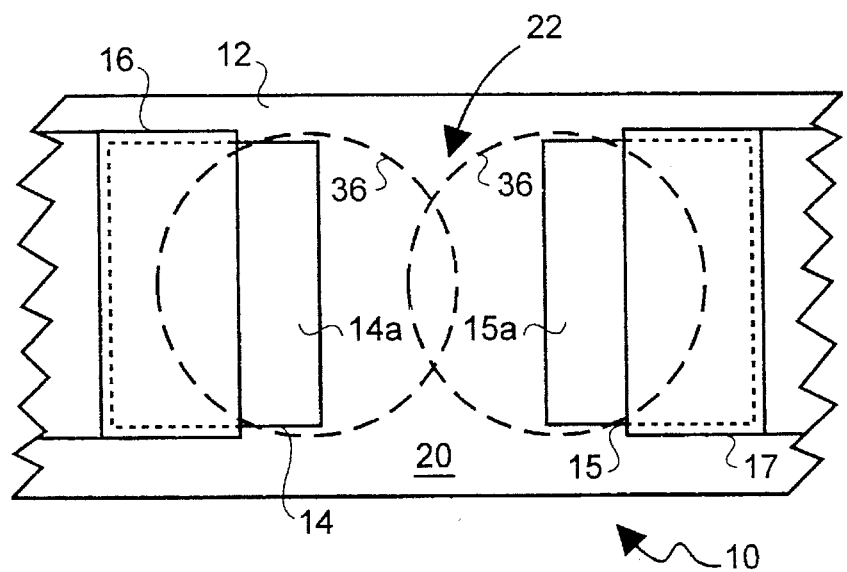
FIG. 2 is a representational top view of the device of FIG. 1.

FIGS. 1 and 2 show side and top views, respectively, of a semiconductor device 10 generally including a semiconductor substrate 12, separate doped regions 14,15, and separate electrical contacts 16,17. Substrate 12 has a top surface 20 into which the doped regions 14,15 are formed and upon which the electrical contacts 16,17 are located. Substrate 12 also includes an undopad region 22 located between the doped regions 14,15. Any suitable material may be used for the substrate 12, with silicon being used for the present embodiment.

Doped regions 14,15 may be formed by any suitable methods such as ion implantation or thermal diffusion, and are formed in the top surface 20 of substrate 12. It is preferred that the regions 14,15 have the same electronic polarity, preferably N+, and receive a high level of ion doping such as $1 \times 10^{15}/cm^2$ or greater.

Separate electrical contacts 16,17 are formed on the top surface 20 of the substrate 12 over each of the ion implanted regions 14,15, respectively, for the purpose of providing electrical contact thereto. Contacts 16,17 cover only a portion of their respective ion implanted regions 14,15 and leave a substantial portion 14a,15a of each of the ion implanted regions 14,15 exposed at the top surface 20 of substrate 12. Electrical contacts may be formed from any suitable materials. In one embodiment, this material is aluminum.

Also shown in FIG. I is the end of a fiber optic cable 24 used to direct radiant energy onto the top surface 20, exposing both of the ion implanted regions 14,15, as well as the undoped region 22. In the preferred embodiment, fiber optic cable 24 includes a pair of adjacent cables 26,28 which are directed toward the exposed portions 14a,15a, the undopad region 22 and interface regions 30,32 therebetween. This arrangement directs a larger amount, or intensity, of radiant energy upon the exposed portions 14a, 15a and interface regions 30,32 than on the undoped region 22 for purposes discussed below. The exact alignment of the fiber optic cables 26,28 will depend upon the specific device geometry. Dotted lines 34 depict the general path of light or other radiant energy from the overall cable 24 to the substrate surface 20. Dotted circles 36 depict the pattern of light or other radiant energy produced on the substrate surface 20 by the pair of adjacent cables 26,28.

The radiant energy directed from fiber optic cable 24 may be of any frequency suitable to excite free carriers in the substrate 12. In one embodiment, infrared energy having a wavelength of approximately one micron is used because such energy penetrates more deeply into the ion implanted regions 14,15. Other radiant energy such as visible light may also he used.

In operation, it has been determined that the use of ion implanted regions exposed at the surface of the substrate to light or other radiant energy significantly helps to increase the current capacity of the device. The electrical characteristics of the device are changed, producing a higher saturation current by a factor of as much as seven. It has also been determined that increasing the amount or intensity of light or other radiant energy directed at the exposed ion implanted regions produces a greater current capacity increase then similarly increasing the amount or intensity directed at the undoped intrinsic silicon 22. This in, roves the efficiency of the light or other radiant energy used to energize the device. This efficiency is an important consideration for the use of laser generated radiant energy in this application and for high density switching environments having limited power available for such switching purposes. It has still further been determined that so increasing the intensity directed at the exposed ion implanted regions on both sides of the device produces a bidirectional effect with substantially identical characteristics for both polarities of operation. This is necessary for r.f. applications. The device also maintains high impedance in the off condition.

Although the operation of the present device has been described in terms of a switching function, it is contemplated that the device as claimed will perform control or signal transmission or modulation functions via the same principles of operation.

The embodiments described above are intended to be taken in an illustrative and not a limiting sense. Various modifications and changes may be made to the above embodiments by persons skilled in the art without departing from the scope of the present invention as defined in the appended claims.

What is claimed is:

1. A semiconductor control device for alternating current signals, comprising:

a substantially undoped semiconductor having a surface thereof exposed for irradiation and a plurality of exposed, similarly doped regions formed at the exposed surface and separated by an exposed undoped portion;

a separate electrical contact formed on the substrate surface over each doped region which contacts only partially cover their respective doped region leaving substantial portions of each doped region exposed at the substrate surface between the electrical contacts; and means for directing radiant energy onto the doped regions and undoped semiconductor for controlling current flow through the substrate in response to an alternating electrical potential thereacross.

2. The control device of claim 1, wherein the means for directing radiant energy exposes the doped region to a higher amount or intensity of radiant energy on average than the undoped semiconductor substrate.

3. The control device of claim 2, wherein the ion implanted region is N+.

4. The control device of claim 3, wherein the doped region is ion implanted or diffused.

5. The control device of claim 4, wherein the ion implanted region is doped to a density of approximately $1 \times 10^{15}/cm2$ or higher.

6. The control device of claim 5, wherein the semiconductor substrate is silicon and further wherein the means for directing radiant energy produces infrared energy.

7. The control device of claim 5, wherein the means for directing radiant energy produces visible energy.

* * * * *